(12) United States Patent
Bos et al.

(10) Patent No.: US 7,124,340 B2
(45) Date of Patent: Oct. 17, 2006

(54) LOW PIN COUNT, HIGH-SPEED BOUNDARY SCAN TESTING

(75) Inventors: Gerardus Arnoldus Antonius Bos, Eindhoven (NL); Hendrikus Petrus Elisabeth Vranken, Eindhoven (NL); Thomas Franciscus Waayers, Eindhoven (NL); David Lelouvier, Herouville (FR); Herve Fleury, Lisieux (FR)

(73) Assignee: Koninklijke Phillips Electronics N.V., Eindhoven (NL)

( * ) Notice: Subject to any disclaimer, the term of this patent is extended or adjusted under 35 U.S.C. 154(b) by 235 days.

(21) Appl. No.: 10/091,051

(22) Filed: Mar. 5, 2002

(65) Prior Publication Data

US 2003/0041296 A1    Feb. 27, 2003

(30) Foreign Application Priority Data

| Mar. 8, 2001 | (EP) | ................................... 01200874 |
| Mar. 9, 2001 | (EP) | ................................... 01200897 |
| Dec. 21, 2001 | (EP) | ................................... 01403353 |

(51) Int. Cl.
     *G01R 31/28* (2006.01)
(52) U.S. Cl. ..................................................... 714/729
(58) Field of Classification Search ................ 714/724, 714/726, 727, 729, 732, 733, 736
     See application file for complete search history.

(56) References Cited

U.S. PATENT DOCUMENTS 4,566,104 A    1/1986  Bradshaw et al.
5,812,561 A *  9/1998  Giles et al. .................. 714/726
6,061,284 A    5/2000  Dingemanse et al. ....... 365/201
6,242,269 B1 * 6/2001  Whetsel ....................... 438/11
6,430,718 B1 * 8/2002  Nayak ......................... 714/727

FOREIGN PATENT DOCUMENTS

EP           0388784 A2     9/1990

* cited by examiner

*Primary Examiner*—Guy Lamarre
*Assistant Examiner*—James C. Kerveros (57) ABSTRACT

In a method for testing a testable electronic device having a first and a second plurality of test a arrangements a first shift register (110) is used in parallel with a second shift register (130) to time-multiplex a first test vector (102) and a second test vector (104) into a number of smaller test vectors (102*a–c*; 104*a–c*) for provision to the first and second plurality of test arrangements. By varying the size of the first shift register (110) and the second shift register (130) a trade-off between the number of pins of the electronic device to be contacted and the required test time can be made. The first shift register (110) may be coupled to a first buffer register (120) and second shift register (130) may be coupled to a second buffer register (140) for enhanced test data stability. First shift register (110) and second shift register (130) can be partitions of a larger shift register. The method can also be used in a reverse way by time-demultiplexing test result vectors into a single vector at the output side of the testable electronic device.

6 Claims, 5 Drawing Sheets

LOW PIN COUNT, HIGH-SPEED BOUNDARY SCAN TESTING

The present invention relates to a method for testing a testable electronic device having a first plurality of test arrangements and a second plurality of test arrangements.

The present invention also relates to a testable electronic device having a first plurality of test arrangements and a second plurality of test arrangements.

The present invention further relates to a test apparatus for testing such an electronic device.

The IBM Journal on Research and Development, Vol. 40, No. 4, pp. 461–474, discloses a test method for testing an electronic device having a first plurality of test arrangements and a second plurality of test arrangements. The costs of integrated circuit (IC) testing and particularly the cost of automated test equipment (ATE) are major concerns for the semiconductor industry. It is expected that future demands on higher speed, greater accuracy, more time sets, increased vector memory, and higher pin-counts will offset all the gains for reducing ATE cost. Incorporating more design-for-testability (DFT) into IC designs is likely to be the only way to reverse the trend of rising ATE costs and to enable the use of low-cost ATE.

The aforementioned prior art discloses a reduced pin-count test method (RPCT) as an enabling DFT technique for low-cost test, which is a technique to reduce the number of IC pins that have to be contacted by the tester. The basic principle of RPCT is that only scan data pins, i.e. input and output pins of the scan chains, e.g. the first plurality of test arrangements, and the test data input (TDI) pin and the test data output (TDO) pin of the boundary-scan chain, test control pins, and clock pins are connected to full-functional tester channels. Access to all remaining functional pins, connecting the second plurality of test arrangements, is achieved via the boundary-scan chain, instead of direct access via the pins.

It is a disadvantage that the application of RPCT only pays off if the number of scan chains is limited. In situations where as many scan chains as pin count allows are integrated in the IC design, RPCT provides no benefits because all pins are used as scan data pins and hence all pins have to be contacted.

It is a first object of the present invention to provide a test method according to the opening paragraph that allows for a reduction of test resources, e.g. test connections or digital tester channels, for testing an electronic device having a large number of test arrangements, e.g. scan chains.

It is a second object of the present invention to provide a testable electronic device according to the opening paragraph having a large number of test arrangements whereby the test arrangements can be tested through a limited number of test connections with a test apparatus.

It is a third object of the present invention to provide a test apparatus according to the opening paragraph with a reduced number of test data channels for testing an electronic device having a large number of test arrangements.

To this end, the invention provides a test method, a testable device and a test apparatus as defined in the independent claims. Advantageous embodiments are defined in the dependent claims.

Now, the first object has been realized by a test method for testing an electronic device as defined in claim 1.

By using multiple shift registers in a parallel fashion to shift test data from and to the electronic device, only a few test data channels, e.g. input/output pins on the electronic device or test channels on a test apparatus, have to be connected to establish test data communication with all test arrangements on the electronic device. Consequently, by choosing the depth of the shift registers, e.g. choosing the size of the pluralities of test arrangements, the trade-off between test speed and required resources can be tuned. This also enables the testing of multiple electronic devices in parallel, because of the reduction in the number of required connections per device under test. Obviously, this provides a large advantage in terms of test cost.

It is an advantage if the method comprises the further steps of copying the first test data from the first shift register into a first buffer register and copying the second test data from the second shift register into a second buffer register.

The presence of the buffer registers enhances the stability of the test data signals to be applied to the device under test during shift mode of the shift registers.

In an embodiment of the method according to the present invention, the step of serially communicating the first test data is directed from the first test data channel to the first shift register; the step of serially communicating the second test data is directed from the second test data channel to the second shift register; the step of parallelly communicating the first test data is directed from the first shift register to the first plurality of test arrangements; and the step of parallelly communicating the second test data is directed from the second shift register to the second plurality of test arrangements.

Preferably, the method of the aforementioned embodiment comprises the further steps of parallelly receiving first test result data from the first plurality of test arrangements in a third shift register, and at least partially simultaneous therewith, parallelly receiving second test result data from the second plurality of test arrangements in a fourth shift register; and serially submitting the first test result data from the third shift register to a third test data channel, and at least partially simultaneous therewith, serially submitting the second test result data from the fourth shift register to a fourth test data channel.

By time-multiplexing the test data input and time-demultiplexing the test data output by using a multitude of at least partially parallelly operating shift registers on both input and output sides of the test arrangement partitions, e.g. the pluralities of test arrangements, the number of required test data channels, e.g. connected pins or test channels on a test apparatus, can be reduced on both sides of the pluralities.

Now, the second object is realized by a testable electronic device as defined in claim 5.

The addition of a multitude of shift registers to an electronic device like an IC, with each shift register being connected to a test data channel, e.g. an input pin or an output pin, enables the at least partially parallel communication of test data with the targeted test arrangements on the electronic device without having to connect all of them to a test apparatus.

It is an advantage if the first shift register is coupled to the second shift register.

Connecting the multitude of shift registers to each other in a chain enables several degrees of hierarchical operation; the multitude of shift registers can operate as a single shift register, or as an independent plurality of shift registers.

It is a further advantage if the first shift register and the second shift register are part of a boundary scan register.

In such an arrangement, the operational mode of the shift register, e.g. as multiple independent shift registers or as a single shift register, can be controlled by the boundary scan state machine. This can, for instance, be achieved by extending the state machine with a number of additional states defining the desired shift and capture behavior of the boundary scan register in multiple shift register mode.

In an embodiment of the electronic device according to the present invention, the first shift register is arranged to communicate the first test data from the first contact to the first plurality of test arrangements, and the second shift register is arranged to communicate the second test data from the second contact to the second plurality of test arrangements, and the electronic device further comprises a third contact and a fourth contact; a third shift register coupled between the third contact and the first plurality of test arrangements for serially submitting first test result data to the third contact, and for parallelly receiving the first test result data from the first plurality of test arrangements; and a fourth shift register coupled between the fourth contact and the second plurality of test arrangements for serially submitting second test result data to the fourth contact at least partially simultaneous with the serial submission of the first test result data, and for parallelly receiving the second test result data from the second plurality of test arrangements at least partially simultaneous with the parallel reception of the first test result data.

By having multiple shift registers for time-demultiplexing the test data output, a reduction of required test data channels on the output side is achieved. This provides a further reduction of the necessary interconnections with the test apparatus. Preferably, the third and fourth register are coupled so that they can operate as a single shift register, which can be part of a boundary scan register. All shift registers on both input and output sides of the test arrangements can be part of this boundary scan register, in which case the boundary scan register is effectively partitioned into smaller subsections under control of the boundary scan state machine to accommodate the desired multiple shift register architecture.

Now, the third object of the invention is realized by a test apparatus as defined in claim 12.

The parallel use of multiple shift registers is also beneficiary on test apparatuses, although the number of interconnections between test apparatus and device under test is not necessarily reduced. An important cost factor in a test apparatus, and in particular a digital test apparatus, is the number of test channels that have to be used to communicate the appropriate test data patterns, e.g. test vectors, with the device under test. This way, test patterns can be sent to or received from the device under test in a parallel form, and serialized by the shift registers. The integration of shift registers between the test channels and the device under test enables a reduction of the required test channels, which is highly advantageous in terms of cost.

It is an advantage if the first shift register is coupled to a first buffer register, and the second shift register is coupled to a second buffer register. The use of buffer registers provides stable output signals when the shift register operates in shift mode, which is desirable in terms of signal integrity.

It is another advantage if the first shift register and the second shift register are responsive to a first clock and the first buffer register and the second buffer register are responsive to a second clock.

This provides facile control over the shift register operation; not only is the shifting of test data through the first and second shift register fully synchronized, but the capture cycle being controlled by a second clock obviates the need for dedicated hardware that has to monitor and interpret the signals from the first clock.

In an embodiment of the test apparatus according to the present invention, the first shift register is arranged to communicate the first test data from the first test channel to the first plurality of test arrangements, and the second shift register is arranged to communicate the second test data from the second test channel to the second plurality of test arrangements, and the test apparatus further comprises a third test channel and a fourth test channel; a third shift register coupled to the third test data channel for serially submitting first test result data to the third test data channel, and for parallelly receiving the first test result data from the first plurality of test arrangements; and a fourth shift register coupled to the fourth data channel for serially submitting second test result data to the fourth test data channel at least partially simultaneous with the serial submission of the first test result data, and for parallelly receiving the second test result data from the second plurality of test arrangements at least partially simultaneous with the parallel reception of the first test result data.

The use of shift registers for both sending test data to and receiving test result data from the device under test enables a reduction of required test channels on both input and output side of the tester. This, advantageously, provides an additional reduction of resource costs of the test apparatus.

It is another advantage if the test apparatus further comprises a first plurality of tri-state buffers, each tri-state buffer from the first plurality of tri-state buffers coupling an output of the first shift register to an input of the third shift register; and a second plurality of tri-state buffers, each tri-state buffer from the second plurality of tri-state buffers coupling an output of the second shift register to an input of the fourth shift register.

In cases where the input and output shift registers share a connection, e.g. a bi-directional pin, with the device under test, an output shift register cell and the device under test may simultaneously drive conflicting test data values on the connection between the test apparatus and the device under test, which is an unwanted event in terms of signal integrity. This can, for instance, be the case if the device under test incorporates input/output boundary scan chains. This unwanted effect can be prevented by the inclusion of a tri-state buffer between the shift register output and such a connection. Obviously, a tri-state buffer can be coupled directly to an output of a shift register cell or to an output of a shift register cell via a buffer register cell.

The invention is described in more detail and by way of non-limiting examples with reference to the accompanying drawings, wherein.

Figure 1A:
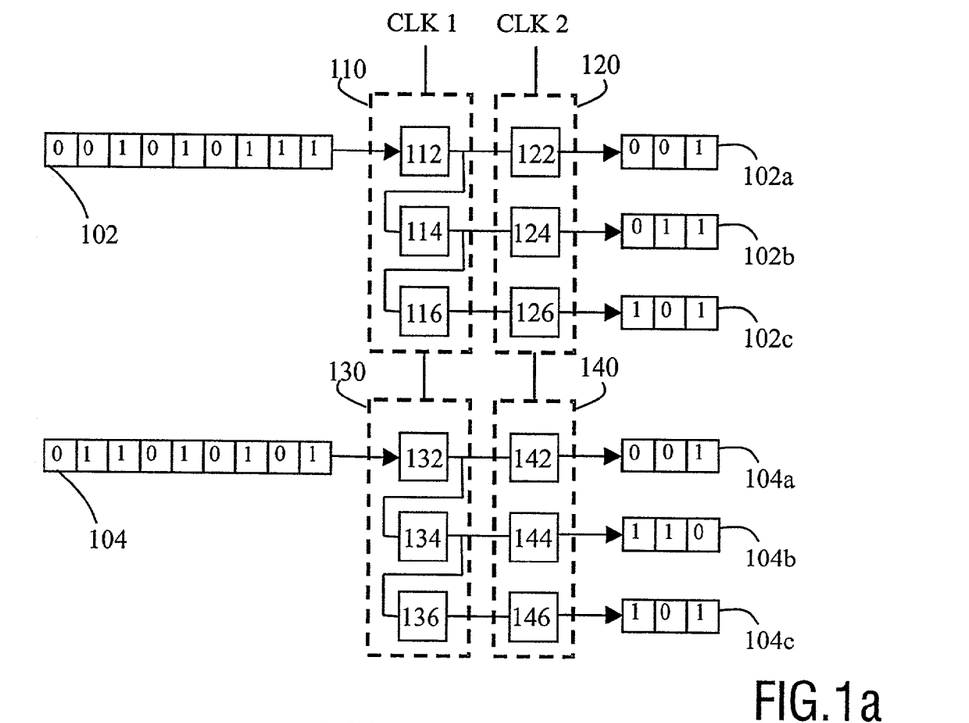
FIG. 1a depicts a method to provide test data to a testable electronic device according to the present invention.
Figure 1B:
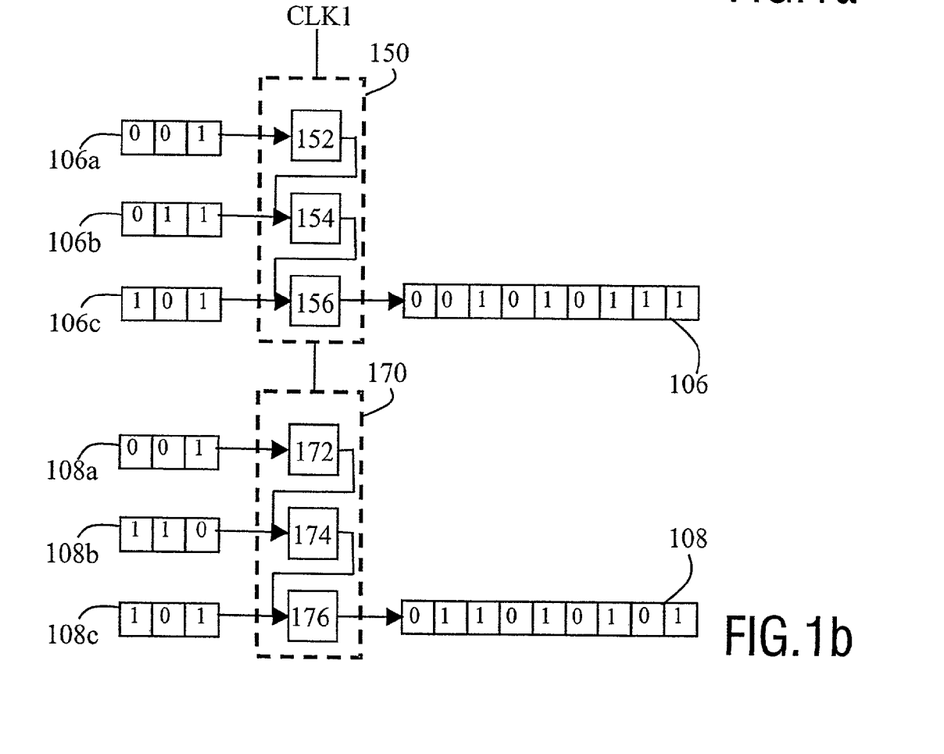
FIG. 1b depicts a method to retrieve test result data from a testable electronic device according to the present invention.

FIGS. 1a and 1b exemplify the test method according to the present invention. According to this method, and depicted in FIG. 1a, a shift register 110 including shift register cells 112, 114 and 116 is used to transform test vector 102 from a test data channel, e.g. an input pin not shown or a tester channel not shown, into smaller test vectors, e.g. test data 102a, 102b and 102c, for a plurality of test arrangements of a testable electronic device, e.g. a device under test (DUT), not shown. Shift register 130 including shift register cells 132, 134 and 136 is used to transform test data vector 104 from a further test data channel not shown into test data 104a, 104b and 104c for a further plurality of test arrangements of a testable electronic device not shown at least partially simultaneous with the operation of shift register 110. Preferably, the operation of shift register 110 and shift register 130 is fully synchronized, for instance by making both shift registers 110 and 130 responsive to the same control signal CLK1, since this leads to a minimization of the test pattern feeding time to the various pluralities of test arrangements.

In a first step, the first bits of test vectors 102 and 104 are serially shifted into shift registers 110 and 130 respectively, until the shift registers 110 and 130 are completely filled. Then, in a second step, the test data is transferred in a parallel fashion from the shift registers 110 and 130 to a first plurality of test arrangements not shown and a second plurality of test arrangements not shown, respectively. These steps are repeated until the test vectors 102a, 102b, and 102c as well as test vectors 104a, 104b and 104c are completely transferred to the DUT not shown.

It is emphasized that, although shift registers 110 and 130 are shown as separate shift registers, they can be partitions of a single shift register like a boundary scan chain or another shift register structure. The optimal size of the partitioning can be determined by the relation $F_{tester}/F_{DUT}$, with $F_{tester}$ being the frequency at which the test data is serially shifted through the shift register and $F_{DUT}$ being the frequency at which the test data is parallelly shifted into/out of the shift register from/into the scan chain. Typically, $F_{tester}$ is the frequency at which the test apparatus operates and $F_{DUT}$ is the internal test frequency of the DUT. Consequently, the test setup is very flexible in terms of test speed; by reducing the size of the partitions, a higher test speed can be achieved although more device pins have to be contacted, and by increasing the partition size a lower test speed is obtained but fewer pins have to be contacted.

In a preferred embodiment, the shift register cells 112, 114 and 116 are coupled to buffer cells 122, 124 and 126, e.g. buffer register 120, respectively, and shift register cells 132, 134 and 136 are coupled to buffer cells 142, 144 and 146, e.g. buffer register 140, respectively. The presence of the buffer registers 120 and 140, under control of a control signal CLK2, provides stable shift register outputs during shift mode of shift registers 110 and 130. Buffer cells 122, 124, 126 and 142, 144, 146 can be formed by flip-flops responsive to an independent clock CLK2. It will be obvious to those skilled in the art that in the case of a partitioned boundary scan register into shift registers 110 and 130 the buffer registers 120 and 140 are always present, since a boundary scan cell contains a shift flip-flop, e.g. a shift register cell, and an update flip-flop, e.g. a buffer register cell.

The method as described above and depicted in FIG. 1a can also be applied on the output side of a DUT, as depicted in FIG. 1b. Shift register 150, which comprises shift register cells 152, 154 and 156, is arranged to receive test result data 106a, 106b and 106c in a parallel fashion and convert into test result vector 106 by serially shifting out the received test data. Similarly, shift register 170, which comprises shift register cells 172, 174 and 176, is arranged to receive test result data 108a, 108b and 108c in a parallel fashion and convert it into test result vector 108 by serially shifting out the received test data at least partially simultaneous with the operation of shift register 150.

More elaborately, in a first step, the first bits of test result data 106a, 106b and 106c are shifted into shift register 150 in a parallel fashion at least partially simultaneous with shifting the first bits of test result data 108a, 108b and 108c into shift register 170. Subsequently, shift registers 150 and 170 are emptied by serially shifting out the test data to respective test data channels not shown before the next bits of test result data 106a, 106b and 106c as well as test result data 108a, 108b and 108c are received. This process is repeated until test result vectors 106 and 108 are completely formed.

It is emphasized that, although in FIG. 1b no buffer registers are present, this is for reasons of clarity only; they may be present without departing from the scope of the invention. In addition, it is stipulated that shift registers 110, 130, 150, 170 and corresponding buffer registers 120 and 140 each have three shift cells by way of non-limiting example only; other shift and buffer register sizes can be chosen without departing from the scope of the invention as well. Furthermore, it will be obvious to those skilled in the art that the teachings of the detailed descriptions of FIG. 1a and FIG. 1b can also be combined without departing from the scope of the invention.

Figure 2:
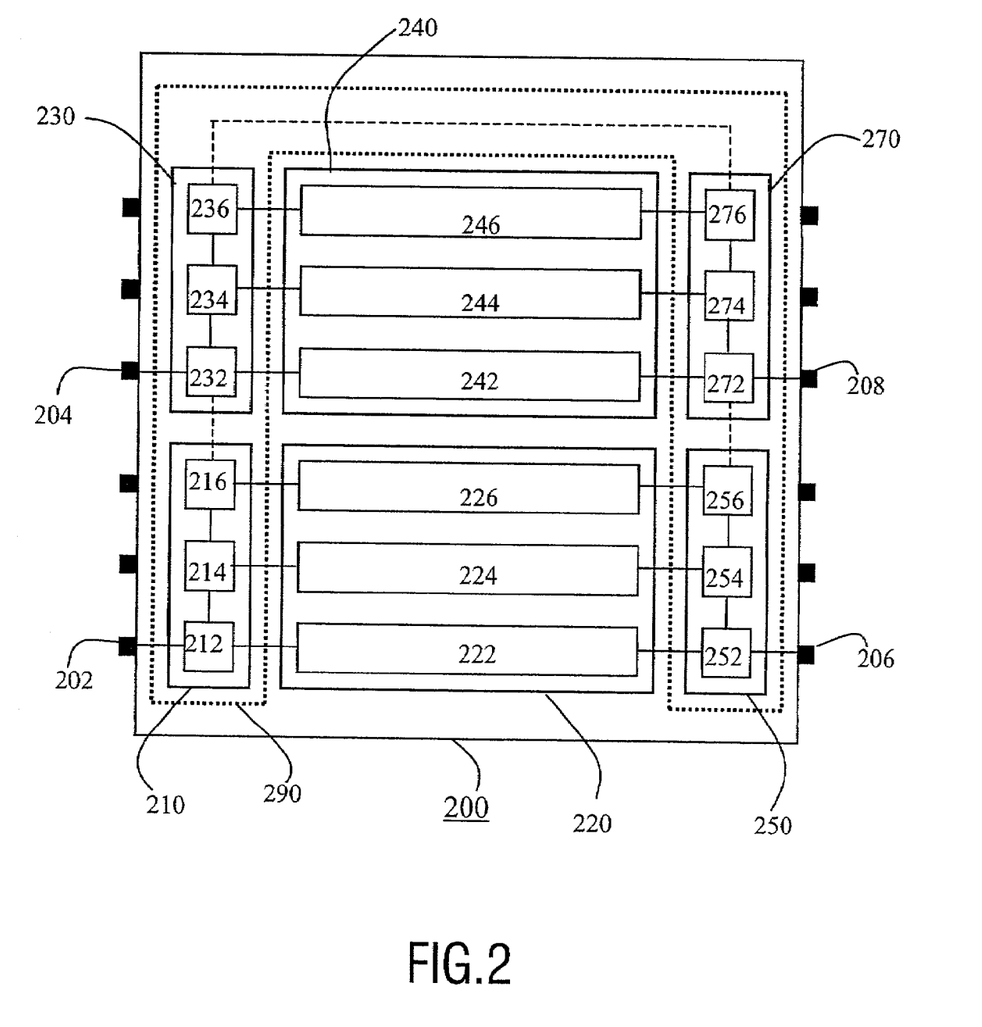
FIG. 2 depicts a testable electronic device according to the present invention.

FIG. 2 depicts a preferred embodiment of a testable electronic device 200 having a first plurality of test arrangements 220 and a second plurality of test arrangements 240. The first plurality of test arrangements includes scan chains 222, 224 and 226, which are respectively coupled between shift register cells 212, 214 and 216 of shift register 210 on the scan chain input side and shift register cells 252, 254 and 256, of shift register 250 on the scan chain output side. Similarly, the second plurality of test arrangements includes scan chains 242, 244 and 246, which are respectively coupled between shift register cells 232, 234 and 236 of shift register 230 on the scan chain input side and shift register cells 272, 274 and 276 of shift register 270 on the scan chain output side. Shift register cell 212 is coupled to input pin 202 of electronic device 200 and shift register cell 232 is coupled to input pin 204 of electronic device 200. On the output side, shift register cell 252 is coupled to output pin 206 of electronic device 200 and shift register cell 272 is coupled to output pin 208 of electronic device 200.

It is emphasized that, preferably, the other scan register cells 214, 216, 234, 236, 254, 256, 274, and 276 are also coupled to their respective input and output pins and that these connections have been omitted for reasons of clarity only. In FIG. 2, shift registers 210, 230, 250 and 270 are interconnected to form boundary scan register 290. It will be understood by those skilled in the art that shift registers 210, 230, 250 and 270 can be independent shift registers as well, and that shift registers 210 and 230 or shift registers 250 and 270 can be omitted from electronic device 200 without departing from the scope of the present invention. Furthermore, with backreference to FIG. 1a and FIG. 1b and their detailed description, it will be obvious to those skilled in the art that shift registers 210 and 230 can be used to simultaneously shift in test vectors 102 and 104 in a serial fashion through respective data in pins 202 and 204, and to output test data 102a, 102b, 102c, 104a, 104b, 104c to scan chains 222, 224, 226, 242, 244 and 246 in a simultaneous and parallel fashion. Similarly, shift registers 250 and 270 can be used to receive test result data 106a, 106b, 106c, 108a, 108b, 108c from scan chains 222, 224, 226, 242, 244 and 246 in a simultaneous and parallel fashion, and to simultaneously shift out test vectors 106 and 108 through respective output pins 206 and 208 in a serial fashion. As previously explained, a control signal, e.g. test clock, CLK1 runs at the tester frequency and controls the shifting in/out of the data in scan registers 210, 230, 250 and 270, whereas an internal control signal, e.g. the DUT test clock, CLK2 runs at the test frequency of the DUT and controls the parallel update of the test data from or to scan registers 210, 230, 250 and 270. Obviously, CLK1 and CLK2 have to be synchronized. It will be obvious to those skilled in the art that the multiplexers not shown inside the various scan cells of scan registers 210, 230, 250 and 270 can be controlled with dedicated control signals to obtain the desired behavior.

It is stipulated that shift registers 210, 230, 250, 270 each have three shift cells by way of non-limiting example only; other shift register sizes, e.g. boundary scan partitions can be chosen without departing from the scope of the invention. In addition, it is emphasized that electronic device 200 can be an integrated circuit consisting of multiple cores, with the surrounding scan chain of electronic device 200, e.g. boundary scan chain 290, providing test data to and from the cores.

Figure 3A:
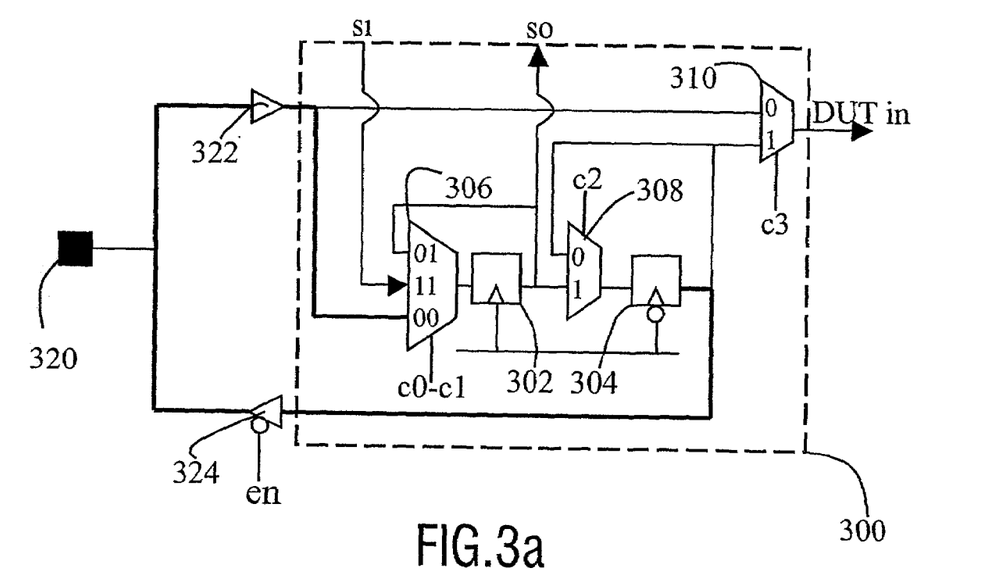
FIG. 3a shows a boundary scan input cell.

The modus operandi of the boundary scan chain 290 for implementation of the partitioned shift register behavior will be explained with the aid of FIG. 3a and FIG. 3b. In FIG. 3a, a known boundary scan input cell 300 is depicted. Boundary scan input cell 300 contains shift flip-flop 302 and update flip-flop 304, which are triggered at opposite edges of boundary scan test clock tck, as well as a multiplexer 306 under control of control bits c0 and c1, a MUX 308 under control of control bit c2 and a MUX 310 under control of control bit c3.

Figure 3B:
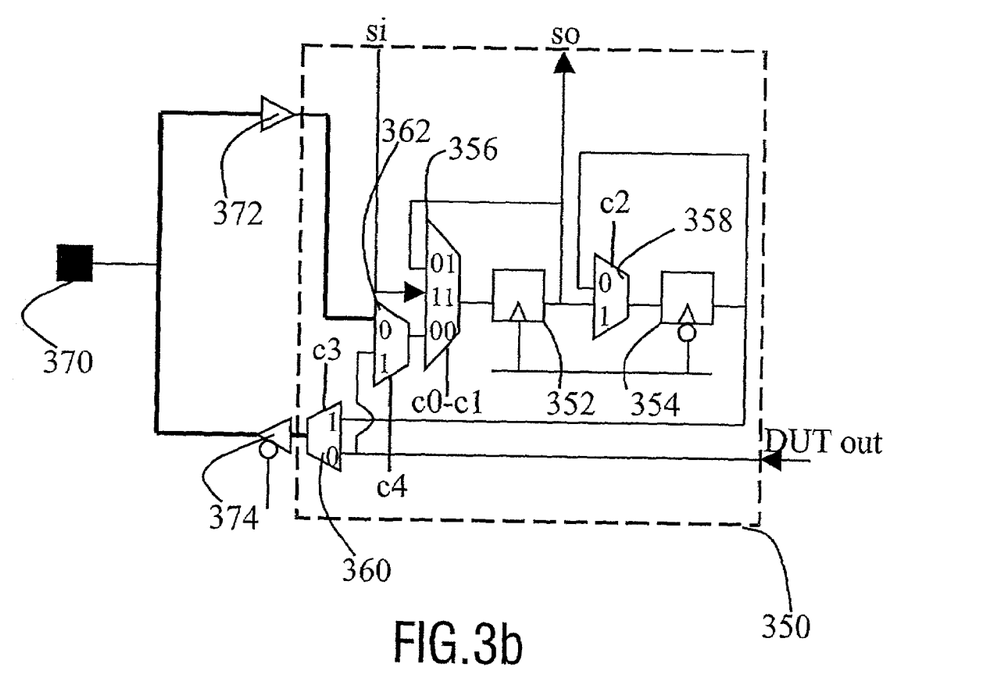
FIG. 3b shows a boundary scan output cell.

In FIG. 3b, known boundary scan output cell 350 contains shift flip-flop 352 and update flip-flop 354, which are triggered at opposite edges of boundary scan test clock tck, as well as a multiplexer 356 under control of control bits c0 and c1, a MUX 358 under control of control bit c2 and a MUX 360 under control of control bit c3. Optionally, boundary scan output cell 350 comprises an additional MUX 362 under control of control bit c4, which function will be explained later (vida infra).

Both boundary scan input cell 300 as well as boundary scan output cell 350 are coupled to a predecessor boundary scan element via scan input si and to a successor boundary scan element via scan output so, according to the IEEE 1149.1 standard. MUX 306 of boundary scan input cell 300 is arranged to receive data from an input pad 320 and MUX 310 is arranged to provide testable electronic device 200 with data, as indicated by DUT in. MUX 360 of boundary scan output cell 350 is arranged to provide data to an output pad 370 and to receive data from testable electronic device 200, as indicated by DUT out. Typically, an input buffer 322 is coupled between input pad 320 and MUX 306, and an output buffer 374 is coupled between output pad 370 and MUX 356.

The boundary scan input cell 300 can optionally be extended with a loopback bath between the update flip-flop 304 and shift flipflop 302 to allow I/O wrap testing of boundary scan input cell 300 when input pin 320 is unused for shifting in test data. Similarly, boundary scan output cell 350 can optionally be extended with a loopback path from update flipflop 354 to shift flipflop 352 for the same reason. In the case of boundary scan output cell 350, the additional MUX 360 is required to ensure the desired controllability of boundary scan output cell 350. The loopback paths are indicated by the bold lines in FIG. 3a and FIG. 3b. Consequently, input pin 320 and output pin 370 are implemented as bi-directional pins when these loopback paths are present. Tri-state buffers 324 and 374, which are controlled by enable signal en, are present to prevent conflicting data being driven to and from pins 320 and 370. Enable signal is set at a fixed value during the serial/parallel or parallel/serial conversion of the test data.

Boundary scan cells 300 and 350 can be configured in various operation modes by means of the respective multiplexers 306, 308, 310 and 356, 358, 360 and, optionally, 362, and their corresponding control signals c0–c4. In functional mode, c3=0, making the boundary scan cells 300 and 350 transparent. In shift mode, c0–c1=11, and data is shifted in/out of shift flip-flop 302, 352 via the scan data input si and scan data output so. In update mode, c2=1, and data is copied from shift flip-flop 302, 352 into update flip-flop 304, 354. In capture mode, c0–c1=00, and data is copied into shift flip-flop 302, 352 from input buffer 322, 372, or from DUT-out, depending on c4. Both shift flip-flops 302, 352 and update flip-flops 304, 354 can operate in hold mode when c0–c1=01 and c2=0. In hold mode, shift flip-flops 302, 352 and update flip-flops 304, 354 hold their data value by capturing their own output.

In the enhanced reduced pin count (E-RPCT) mode, e.g. the mode according to the present invention, the control scheme differs from the standard boundary scan control scheme. Table I shows the control signals for the boundary scan cells 300 and 350 during E-RPCT at contacted input pin 320 and contacted output pin 370, e.g. the situation where the boundary scan input cell 300 and boundary scan output cell 350 are first cells in a shift register partition and are used to receive/provide serial data from/to input pin 320 and output pin 370. In addition, Table I also shows the control signals for the boundary scan cells 300 and 350 during E-RPCT at uncontacted input pin 320 and uncontacted output pin 370, e.g. the situation where the boundary scan input cell 300 and boundary scan output cell 350 are further cells of a shift register partition.

TABLE I

Control signal values in E-RPCT mode.

| pin type | c0 | c1 | c2 | c3 | c4(*) |
|---|---|---|---|---|---|
| contacted input | 0 | 0 | upd | | 1 |
| uncontacted input | 1 | 1 | upd | | 1 |
| contacted output | cap | cap | 1 | 1 | 1 |
| uncontacted output | cap | cap | | 1 | |

(*)only when I/O wrap test is implemented.

The value upd for c2 at input pin 320 controls whether the update flip-flop 304, which functions as a buffer register cell, operates in hold mode or captures data from shift flip-flop 302. Typically, this data capture will take place when the shift register partition is filled with the test data to be fed to the testable electronic device 200.

The value cap for c0–c1 at output pin 370 controls whether shift flip-flop 352 operates in shift mode or captures data from the testable electronic device 200. Typically, this data capture will take place when the shift register partition is shifting out the test result data from the testable electronic device 200.

Typically, shift flip-flops 302 and 352 capture data at the positive edge of the boundary scan test clock, and update flip-flops 304 and 354 capture data at the negative edge of the boundary scan test clock. However, the testable electronic device 200 is typically clocked by an internal test clock. Data transfer from the boundary scan chain to the testable electronic device 200 therefore implies communication between two different clock domains, and the boundary scan test clock and the internal test clock should be synchronized. The signal values upd and cap for c2 and c0–c1 can be modified to maximize the skew margins. As explained previously, the ratio of the tester clock and the internal clock determines the partitioning size of the boundary scan chain 290.

It will be obvious to those skilled in the art that the above described operational mode of the boundary scan chain 290 can also be applied to configure separate shift registers for E-RPCT.

Figure 4:
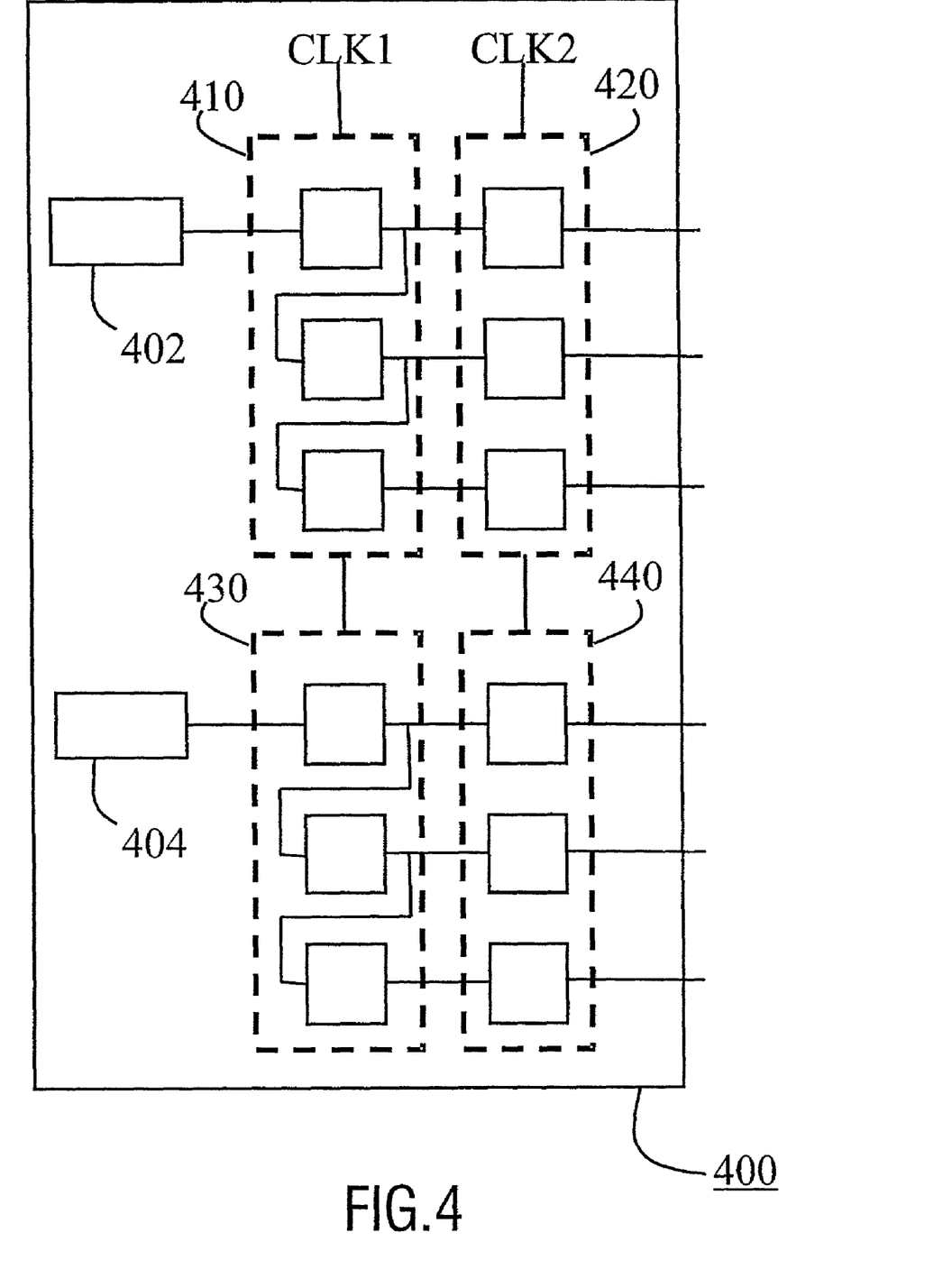
FIG. 4 depicts a test apparatus according to an embodiment of the present invention.

The teachings of the present invention can also be used in order to reduce the amount of expensive hardware in test apparatuses, as depicted in FIG. 4. Test apparatus 400 comprises a first shift register 410 coupled to a first test data channel 402 and a second shift register 430 coupled to a second test data channel 404. The shift operation of first shift register 410 and second shift register 430 is controlled by control signal CLK1. In a preferred embodiment, first shift register 410 is coupled to a first buffer register 420 and second shift register 430 is coupled to a second buffer register 440 in order to obtain stable input/output signals during shift mode of shift registers 410 and 430. Preferably, first buffer register 420 and second buffer register 440 are controlled by control signal CLK2. Obviously, CLK1 and CLK 2 have to be synchronized to obtain the correct shift/update behavior.

The use of a number of shift registers 410 and 430 has the advantage that not every test data pattern to be provided to or to be received from a I/O pin of a DUT has to be generated by or evaluated by dedicated tester hardware, e.g. test data channels 402 and 404. Instead, multiple test data patterns to be outputted to a DUT, i.e. test data 102a, 102, 102c from FIG. 1a, can be generated in the form of a single test vector, i.e. test vector 102 from FIG. 1a, and subsequently unraveled by first shift register 410 or second shift register 430 after reception of the test vector from first test data channel 402 or second test data channel 404. Similarly, shift registers like first shift register 410 and second shift register 430 can be used to receive test result data from a DUT and convert the test result data into a single test result vector before providing it to test data channel 402 and 404 for evaluation. Both approaches are particularly advantageous in the digital test arena, because digital test data channels are expensive.

It is noted that in principle an unpartitioned single shift register could be used, although this would cause an undesirable lengthening of the test time of the DUT. However, it will be obvious to those skilled in the art that a single shift register partitioned into a number of shift register partitions, e.g. a first shift register partition 410 and a second shift register partition 430 is at least as acceptable as an implementation with a separate first shift registers 410 and a second shift register 430. The depth n of the shift registers or shift register partitions is governed by the following test apparatus 400 requirements:

$$F_{max} \geq n \ast F_s \text{ and}$$

$$Mem_{width} \geq n \ast L$$

with $F_{max}$ being the test data channel maximum frequency, $F_s$ being the standard shift frequency, $Mem_{width}$ being the available memory per test data channel and L being the length of the test vector, i.e. the summation of the lengths of the required test data patterns. Now, n can be determined by:

$$n = Int\left(\min\left(\frac{F_{max}}{F_s}, \frac{Mem_{width}}{L}\right)\right)$$

with Int indicating a truncation to an integer and min indicating the minimum value of the two terms in between brackets.

Figure 5:
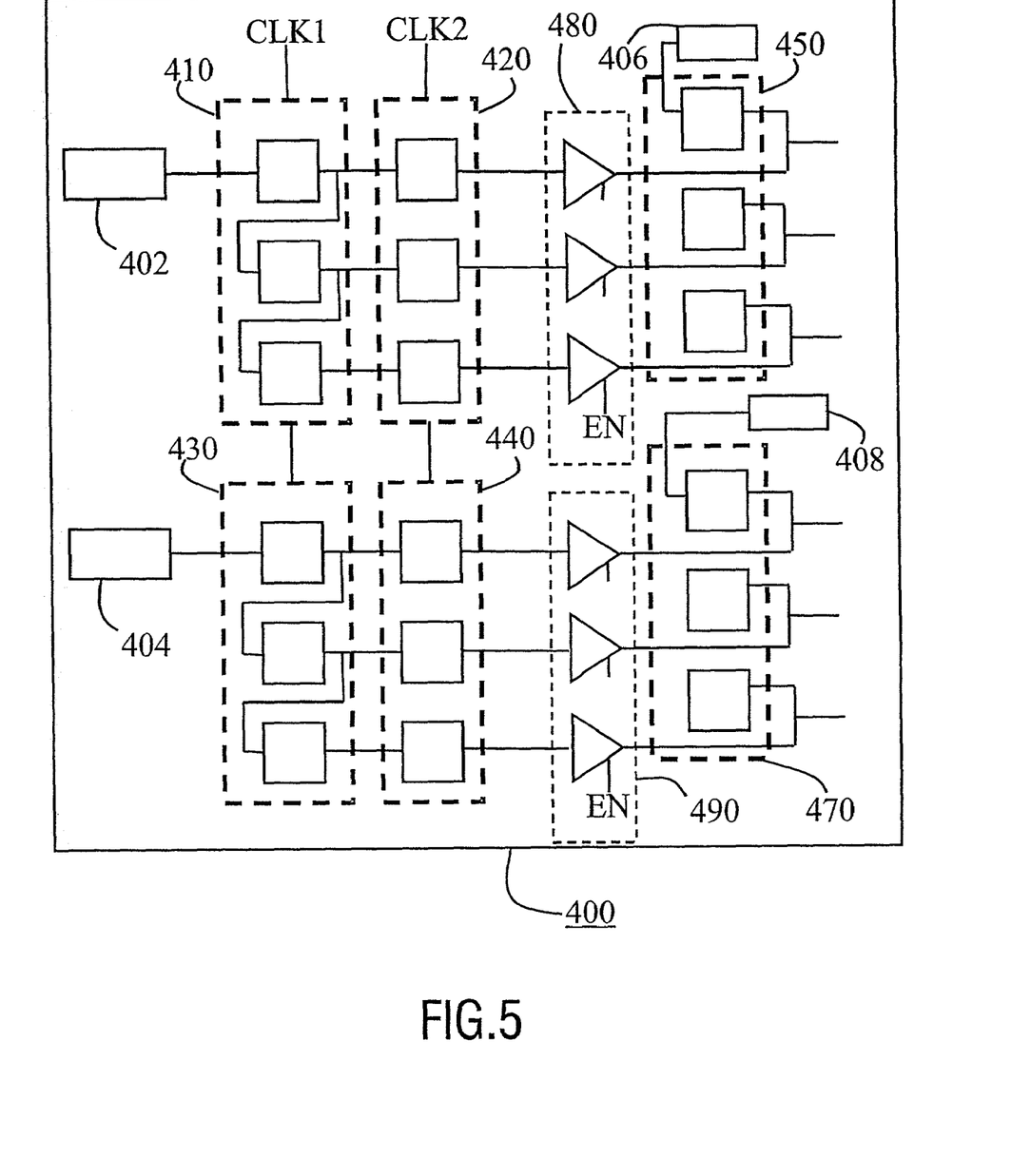
FIG. 5 depicts a test apparatus according to another embodiment of the present invention.

FIG. 5 is described in backreference to FIG. 4. Corresponding reference numerals have the same meaning unless explicitly stated otherwise. FIG. 5 shows a test apparatus 400 for connecting to a DUT having bi-directional pins. Test apparatus 400 additionally comprises a third shift register 450 coupled to a third test data channel 406 and a fourth shift register 470 coupled to a fourth test data channel 408. First shift register 410 is arranged to send test data from first test data channel 402 to a first plurality of test arrangements on the DUT, second shift register 430 is arranged to send test data from second test data channel 404 to a second plurality of test arrangements on the DUT, third shift register 450 is arranged to receive test result data from the first plurality of test arrangements on the DUT and transfer it to the third test data channel 406, and fourth shift register 470 is arranged to receive test result data from the second plurality of test arrangements on the DUT and transfer it to the fourth test data channel 408.

Buffer registers 420 and 440 are omitted for reasons of clarity only, they may still be present without departing from the scope of the invention. In addition, buffer registers may be optionally coupled to shift registers 450 and 470 as well.

Apparently, the shift register cells of first shift register 410 and the shift register cells of third shift register 450 share an I/O connection to the first plurality of test arrangements on the DUT. Similarly, the shift register cells of second shift register 430 and the shift register cells of fourth shift register 470 share an I/O connection to the second plurality of test arrangements on the DUT. In order to prevent conflicting values being driven on these interconnections, a shift register cell of first shift register 410 is coupled to a test apparatus 400 I/O connection via a tri-state buffer under control of an enable signal en. In other words, the outputs of first shift register 410 are coupled to the inputs of third shift register 450 via a first plurality of tri-state buffers 480. Similarly, the outputs of second shift register 420 are coupled to the inputs of fourth shift register 470 via a second plurality of tri-state buffers 490.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. Method for testing a testable electronic device having a first plurality of test arrangements, a second plurality of test arrangements, a first shift register having a plurality of cells and a second shift register having a plurality of cells, each cell of the first shift register being coupled between an external pin and one of the test arrangements from the first plurality of test arrangements and each cell of the second shift register being coupled between an external pin and one of the test arrangements from the second plurality of test arrangements, the method comprising the steps of:
    serially communicating first test data between a first shift register and a first test data channel, and at least partially simultaneous therewith, serially communicating second test data between a second shift register and a second test data channel; and
    parallelly communicating the first test data between the first plurality of test arrangements and the first shift register, and at least partially simultaneous therewith, parallelly communicating the second test data between the second plurality of test arrangements and the second shift register.

2. A method as claimed in claim 1, comprising the further steps of copying the first test data from the first shift register into a first buffer register and copying the second test data from the second shift register into a second buffer register.

3. A method as claimed in claim 1, wherein:
    the step of serially communicating the first test data is directed from the first test data channel to the first shift register;
    the step of serially communicating the second test data is directed from the second test data channel to the second shift register;
    the step of parallelly communicating the first test data is directed from the first shift register to the first plurality of test arrangements; and
    the step of parallelly communicating the second test data is directed from the second shift register to the second plurality of test arrangements.

4. A method as claimed in claim 3, comprising the further steps of:
    parallelly receiving first test result data from the first plurality of test arrangements in a third shift register, and at least partially simultaneous therewith, parallelly receiving second test result data from the second plurality of test arrangements in a fourth shift register; and
    serially submitting the first test result data from the third shift register to a third test data channel, and at least partially simultaneous therewith, serially submitting the second test result data from the fourth shift register to a fourth test data channel.

5. A testable electronic device, comprising:
    a first plurality of test arrangements and a second plurality of test arrangements;
    a first external pin and a second external pin;
    a first shift register register having a plurality of cells, each cell being coupled between an external pin and one test arrangement of the first plurality of test arrangements, a first cell being coupled to the first external pin for serially communicating first test data with the first external pin, and for parallelly communicating the first test data with the first plurality of test arrangements; and
    a second shift register having a plurality of cells, each cell being coupled between an external pin and one test arrangement of the second plurality of test arrangements, a first cell being coupled to the second external pin for serially communicating second test data with the second external pin at least partially simultaneous with the serial communication of the first test data, and for parallelly communicating the second test data with the second plurality of test arrangements at least partially simultaneous with the parallel communication of the first test data.

6. A testable electronic device as claimed in claim 5, wherein the first shift register is arranged to communicate the first test data from the first external pin to the first plurality of test arrangements, and the second shift register is arranged to communicate the second test data from the second external pin to the second plurality of test arrangements, and wherein the electronic device further comprises:
    a third external pin and a fourth external pin;
    a third shift register having a plurality of cells, each cell being coupled between an external pin and one test arrangement of the first plurality of test arrangements, a first cell being coupled to the third external pin for serially submitting first test result data to the third external pin, and for parallelly receiving the first test result data from the first plurality of test arrangements; and
    a fourth shift register having a plurality of cells, each cell being coupled between an external pin and one test arrangement of the second plurality of test arrangements, a first cell being coupled to the fourth external pin for serially submitting second test result data to the fourth external pin at least partially simultaneous with the serial submission of the first test result data, and for parallelly receiving the second test result data from the second plurality of test arrangements at least partially simultaneous wit the parallel reception of the first test result data.

* * * * *